United States Patent
Akhtar et al.

(10) Patent No.: US 6,741,463 B1
(45) Date of Patent: May 25, 2004

(54) RACK MOUNTABLE DOCKING STATION

(75) Inventors: Fahim M. Akhtar, Austin, TX (US); Pete A. Martinez, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/355,805

(22) Filed: Jan. 31, 2003

(51) Int. Cl.[7] .................................................. G06F 1/16
(52) U.S. Cl. ..................... 361/686; 361/727; 312/223.1; 312/223.2
(58) Field of Search ................................ 361/683–686, 361/727; 439/131; 709/223; 710/303, 304; 312/223.1, 223.2, 223.3

(56) References Cited

U.S. PATENT DOCUMENTS

| | | | |
|---|---|---|---|
| 5,199,892 A | * 4/1993 | Campbell et al. | 439/246 |
| 5,875,094 A | 2/1999 | Kirkendoll | 361/686 |
| 5,913,034 A | 6/1999 | Malcolm | 395/200.53 |
| 6,142,593 A | 11/2000 | Kim et al. | 312/223.2 |
| 6,239,969 B1 | 5/2001 | Howell et al. | 361/686 |
| 6,321,340 B1 | 11/2001 | Shin et al. | 713/310 |
| 6,483,709 B1 | * 11/2002 | Layton | 361/724 |
| 2003/0002261 A1 | * 1/2003 | Berry et al. | 361/727 |
| 2003/0111436 A1 | * 6/2003 | Basinger et al. | 211/183 |

* cited by examiner

Primary Examiner—Darren Schuberg
Assistant Examiner—Anthony Q. Edwards
(74) Attorney, Agent, or Firm—Baker Botts L.L.P.

(57) ABSTRACT

An information handling system includes at least one computing component, at least one docking station, and a rack structure. The computing component includes a component housing and at least one connector plug on a rear face. The rack structure releasably maintains the computing components and includes a first railing and a second railing coupled to a rear section. The docking station includes a front face and a rear face and is slidably disposed between the first railing and the second railing allowing for horizontal movement along the first and second railings. The docking station further includes one or more data ports on the rear face coupling with one or more data cables and at least one connector port on the front face. The connector port couples with the connector plug on the computing component such that the one or more data cables communicatively couple with the computing component.

20 Claims, 3 Drawing Sheets

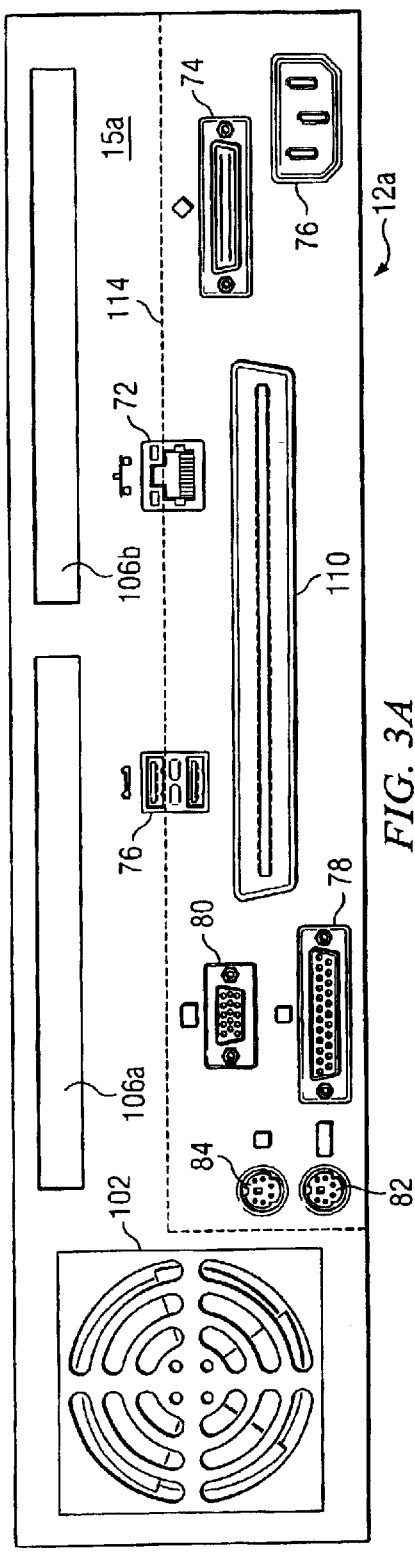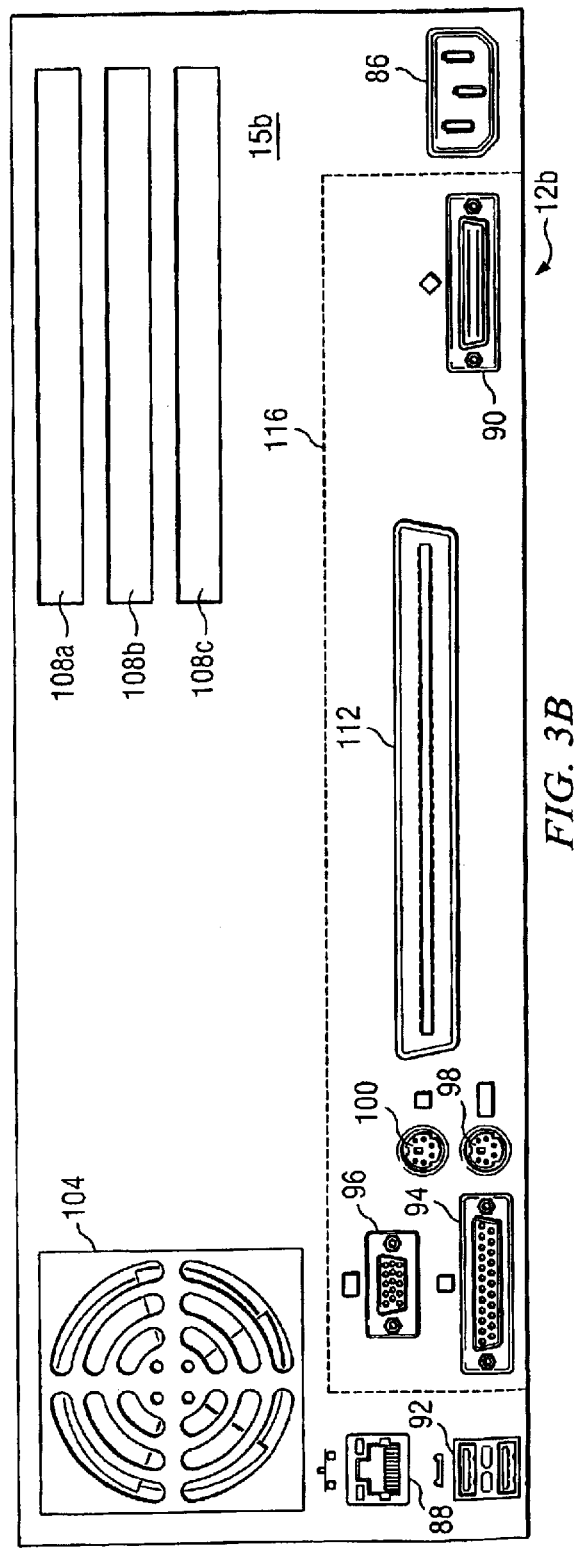
FIG. 3A
FIG. 3B

RACK MOUNTABLE DOCKING STATION

TECHNICAL FIELD

This disclosure relates in general to the field of information handling systems, and more particularly to a rack mountable docking station.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling system users' computing and processing needs increase, the information handling systems require greater processing capabilities, flexibility, and serviceability. To satisfy the increased processing requirements, consumers and businesses have turned to utilizing numerous information handling systems such as servers. The servers are typically mounted in a standardized server rack structure allowing for numerous servers that do not occupy a large amount of floor-space. Conventional rack-mounted U-sized servers (a U is a standard unit of measure for designating the height in computer enclosures and rack cabinets where 1U equals 1.75 inches) typically range in size from 1U to 7U and the server rack structures typically measure 42U and can accommodate a combination of various U-sized servers. The servers are mounted on sliding guides within the server rack structure that allow for the servers to slide in and out of the server rack structure for installation and servicing.

When a rack mountable server is installed in a server rack structure, numerous cables must be connected to the rear of the server so that the server can function correctly and communicate with other systems. These cables include power cords, video cables, keyboard and mouse cables, SCSI cables, USB cables, networking cables, and any other appropriate type of cabling required for server operation. Typically when the cables are connected to the rack mounted servers, the length of the cables is long enough to allow the servers to slide out of the server rack structure, but not be removed, without disconnecting any of the cables attached to the rear of the servers. Given that a typical server rack structure is approximately three feet deep, such excess cable lengths allowances create an excess of three feet per cable per server when the server is completely installed within the server rack structure. The excess cabling creates cable disorder especially when considering a 42U server rack structure having forty-two 1U servers installed. Even with only each server having only five cables, there are 210 cables at the rear of the server rack structure and over 600 feet of excess cable.

Furthermore, with each server requiring more than one data cable, the installation and removal of a server from the server rack structure is an arduous and time consuming task. In order to completely remove the server from the server rack structure, all the data cables must be disconnected from the rear of the server and stored behind the server rack structure. And if a service technician is removing more than one server from the server rack structure, the data cables must be marked or grouped so that the service technician will be able to correctly reattach the data cables to the correct servers and the correct ports on the servers when reinstalling the servers into the server rack structure. Furthermore, having to disconnect and reattach the data cables from the server when removing the server from the server rack structure creates a disincentive to removing the servers once the servers are installed whether the servers need to be removed for servicing or just to optimize space in the server rack structure. In addition, if the disconnection and reattachment of the data cables to the servers is done incorrectly and quickly without the proper attention to detail, the servers may not function correctly and experience errors that may not be easily diagnosed as data cable connection errors.

SUMMARY

Therefore, a need has arisen for a system that simplifies the installation and removal of a computing component from a rack structure.

A further need has arisen for a system that allows a computing component to be installed and removed from a rack structure without connecting or disconnecting data cables from the computing component.

In accordance with the teachings of the present disclosure, an information handling system and docking station are described which substantially eliminate or reduce disadvantages with previous systems and methods. A rack mountable docking station allows for one or more computing components to be installed or removed from a rack structure without disconnecting or attaching one or more data cables.

In accordance with one aspect of the present disclosure, an information handling system is provided. The information handling system includes a computing component having a component housing and at least one connector plug on a rear face of the computing component. A rack structure releasably maintains at least one of the computing components and includes a first railing and a second railing, the first and second railing coupled to a rear section of the rack structure. A docking station including a front face and a rear face is disposed between the first railing and the second railing and horizontally slides along the first and second railings. The docking station further includes one or more data ports and at least one connector port. The data ports are located on the rear face and couple with one or more data cables. The connector port is located on the front face of the docking station and couples with the connector plug on the computing component allowing the one or more data cables to communicatively couple with the computing component.

In another aspect of the present disclosure, a rack mountable docking station is disclosed. The docking station includes a housing having a front face and a rear face. The housing is disposed between a first railing and a second railing with the front face slidably coupled to the first railing and the rear face slidably coupled to the second railing. The docking station further includes a connector port on the front face and one or more data ports on the rear face. The data ports couple with one or more data cables while the connector port couples with a connector plug on a rack mountable computing component such that the data cables are in communication with the rack mountable computing component.

In another aspect of the present disclosure, a server docking station is disclosed. The server docking station includes a housing disposed in a rear section of a server rack. The housing includes a front face and a rear face where the front face includes a connector port and the rear face includes one or more data ports. The data ports couple with one or more data cables while the connector port couples with a connector plug on a server thereby allowing the data cables to communicate with the server.

The present disclosure provides a number of important technical advantages. One important technical advantage is the installation and removal of computing components from the rack structure without requiring the disconnection and reattachment of the data cables. The connector port on the docking station and the connector plug on the computing component allow the computing component to move in and out of the rack structure without disconnecting the data cables. With a typical computing component in a rack structure, the data cables connect directly to the computing component. But in the present disclosure, the data cables connect to the data ports of the docking station and the data from the data cables is communicated from the data ports to the connector port to the connector plug of the computing component. The computing component only directly interfaces with the connector port of the docking station and does not need to directly interface with the data cables. Therefore, in order to remove the computing component from the rack structure, a user only needs to remove the computing component from the connector port and the data cables remain connected to the data ports on the docking station and do not have to be disconnected. In addition, service of the computing components requires less time because the service technician does not have to take the time to disconnect and then reattach the data cables when servicing and does not have to worry about marking or labeling the data cables in order to insure that the data cables are reattached correctly.

Another important technical advantage of the present disclosure is the simplification of the installation and removal of the computing component within the rack structure. Because the computing component only interfaces with the connector port of the docking station, moving the computing component within the rack structure along the guides requires only disconnecting the connector plug from the connector port. Because the data cables are not directly connected to the computing component, the data cables do not require the extra three feet of length necessary on typical server rack structures to accommodate for sliding the computing component within the rack structure. Therefore when the computing components are installed in the rack structure, there is not the extra three feet of data cables at the rear of the rack structure making it difficult the locations of the cables. Furthermore, the docking station can be installed into most existing server rack structures and implemented with most rack mount server platforms.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 3A–3B illustrate rear faces of two embodiments of example computing components.

DETAILED DESCRIPTION

Preferred embodiments and their advantages are best understood by reference to the figures, wherein like numbers are used to indicate like and corresponding parts.

Previous systems and method for rack mountable computing components have been designed so that each computing component directly connects with one or more data cables. In order to remove the computing component from the rack structure, a user must disconnect the data cables from the computing component. In order to install the computing components in the rack structure, the user must reattach the data cables to the rear of the computing component. Because installing and removing the computing component from the rack structure requires disconnecting and reattaching the data cables, the removal and installation of computing components in the rack structure is a time consuming and frustrating task especially when multiplied by numerous computing components in one rack structure. The present disclosure allows for an information handling system including a docking station that allows a computing component to be installed and removed from a rack structure without disconnecting or reattaching the data cables.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
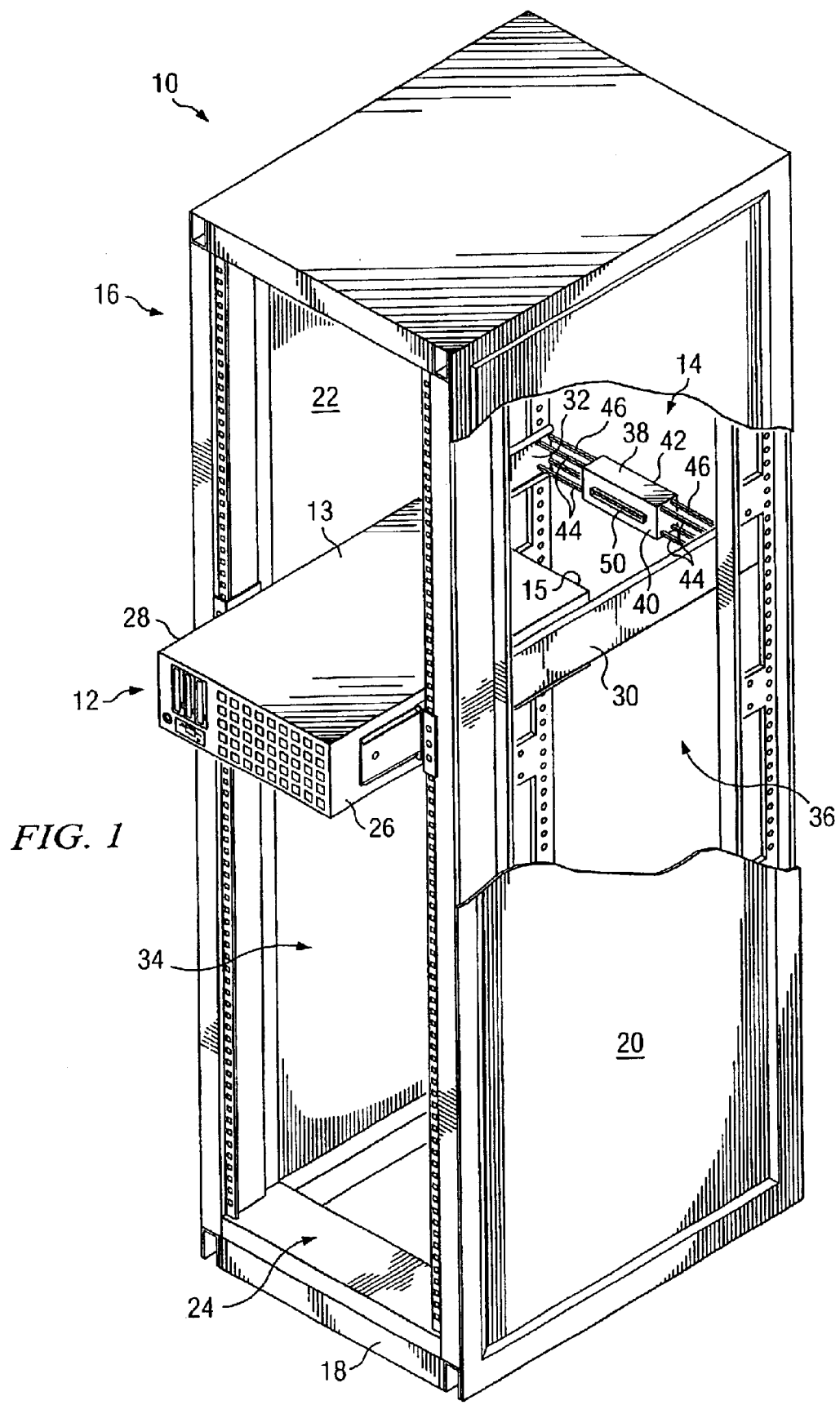
FIG. 1 illustrates a perspective diagram of an example information handling system.

FIG. 1 illustrates a perspective diagram of information handling system 10 including computing component 12, docking station 14, and rack structure 16. Information handling system 10 shown in FIG. 1 represents one configuration for computing component 12, docking station 14, and rack structure 16. Information handling system 10 may be utilized in a computing center such as those used in any computer hardware intensive environment. In the embodiment shown in FIG. 1, rack structure 16 of information handling system 10 is a 42U rack structure operable to accept forty-two 1U computing components 12 slidably disposed therein. In alternative embodiments, rack structure 16 may accept any combination and number of U-sized computing components 12 such that the total height of computing components 12 does not exceed 42U. Computing component 12 may be a conventional U-shaped server, a modular server such as a blade server or a brick server, a network hub, a storage device, a power supply, or any other appropriate rack mountable computing component. Computing component 12 may further include at least one processor and memory disposed within component housing 13 and rear face 15 including a plurality of data ports and data plugs as described below.

In the embodiment of FIG. 1, rack structure 16 stands upright on base 18 and may be adjoined or positioned next to other rack structures at either first side 20 or second side 22. In one embodiment of rack structure 16, computing components 12 may be removed from rack structure 16 through front opening 24 of rack structure 16. Component housing 13 of computing component 12 includes first side 26 and second side 28. First side 26 and second side 28 are configured to engage respective guides 30 and 32 such that first side 26 engages first guide 30 and second side 28 engages second guide 32. Once engaged, computing component 12 may be displaced in a horizontal back and forth motion within rack structure 16 either from front section 34 of rack structure 16 to rear section 36 of rack structure 16 or from rear section 36 to front section 34. Such displacement is desirable in scenarios where computing component 12 is being installed, replaced, or serviced.

Docking station 14 of information handling system 10 is disposed within rear section 36 of rack structure 16 and may be disposed within most existing rack structures. Docking station 14 includes housing 38, front face 40, and rear face 42. First railing 44 and second railing 46 are disposed in rear section 36 of rack structure 16 and are coupled to rack structure via mounting brackets 48. In the embodiment of FIG. 1, docking station 14 is slidably disposed between first railing 44 and second railing 46 with front face 40 slidably coupled to first railing 44, rear face 42 slidably coupled to second railing 46, and docking station 12 having a width less than the width of rack structure 16 and computing component 12. This allows docking station 14 to horizontally slide along first railing 44 and second railing 46 from first side 20 to second side 22 and from second side 22 to first side 20. While allowing horizontal movement, first railing 44 and second railing 46 prevent docking station 14 from any vertical movement. In alternative embodiments, docking station 14 may be fixedly disposed in rear section 36 of rack structure 16 by either being fixedly attached to first railing 44 and second railing 46 or directly coupled to rear section 36 of rack structure 16. When fixedly coupled, docking station 14 is not capable of any horizontal movement or vertical movement. Furthermore, in alternative embodiments, docking station 14 may be of the same width of computing component 12 and rack structure 16.

Figure 2A:
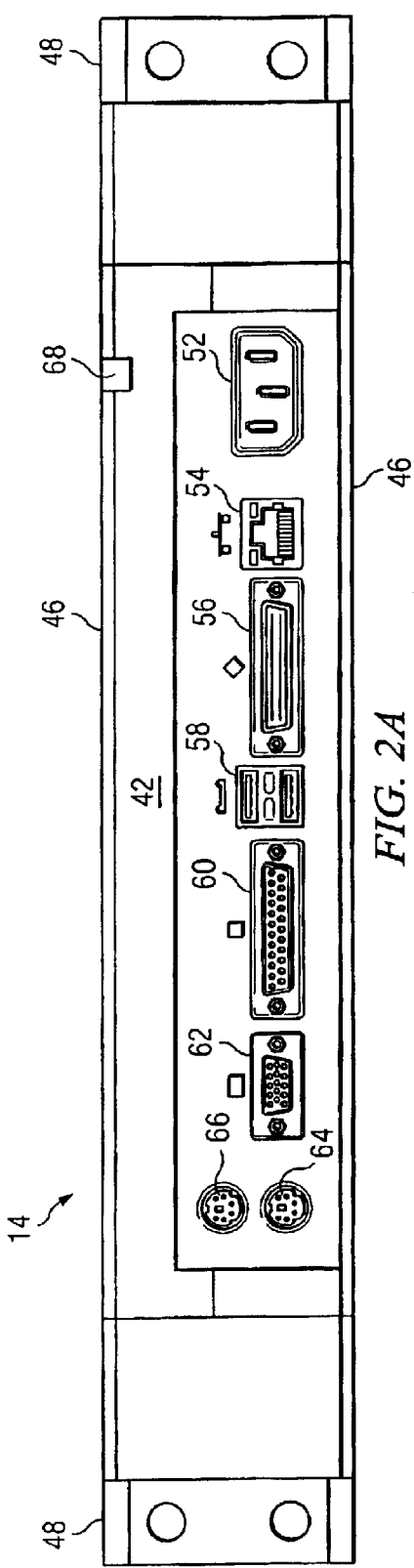
FIGS. 2A–2B depict a front and rear face of one embodiment of an example docking station.
Figure 2B:
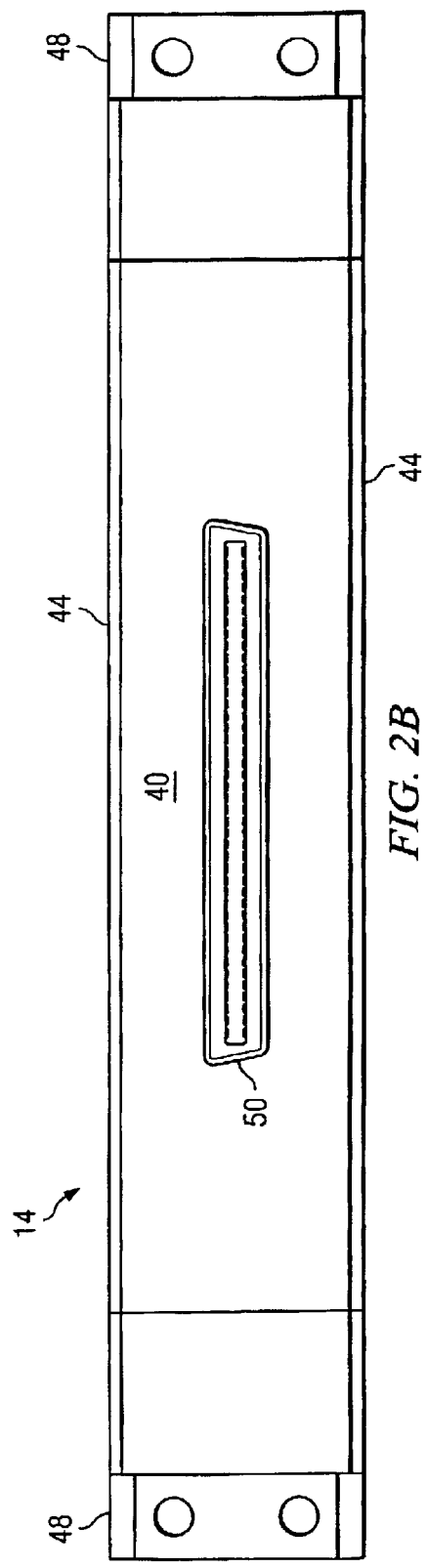

FIG. 2A depicts rear face 42 of docking station 14 and FIG. 2B depicts front face 40 of docking station 14 where docking station 14 is slidably disposed between first railing 44 and second railing 46. Rear face 42 includes a plurality of different data ports typically found on computers, servers, laptops, or any other appropriate computing components. Rear face 42 of docking station 14 may be configured with power port 52, network port 54, SCSI (Small Computer System Interface) port 56, USB (Universal Serial Bus) ports 58, parallel port 60, video port 62, keyboard port 64, and mouse port 66. Data ports 54–66 and power port 52 are operable to couple with one or more data cables from one or more devices or power supplies. For instance, video port 62 may interface with a data cable from a computer monitor, parallel port 60 may interface with a parallel data cable from a printer, and power port 52 may couple with a power cord from a wall outlet. In alternate embodiments, rear face 42 of docking station 14 may include a different arrangement of data ports or additional data ports such as Firewire ports, audio/video ports, and any other appropriate computing data ports.

Docking station 14 further includes rail lock 68. As shown in the embodiment of FIG. 2A, rail lock 68 is coupled to the right of docking station 14 on second railing 46 but in alternative embodiments rail lock 68 may be located on second railing 46 on either side of docking station 14, on docking station 14, or include additional rail locks with one on each side of docking station 14. As stated above, docking station 14 slides horizontally between first side 20 and second side 22 of rack structure 16 along first railing 44 and second railing 46 where docking station 14 has a docking station width less than the width of rack structure 16 and computing component 12. But a user may desire to prevent docking station 14 from sliding horizontally along first railing 44 and second railing 46. Rail lock 68 allows the user to lock docking station 14 in place and thereby prevent docking station 14 from exhibiting any horizontal movement. In the embodiment of FIG. 2A, rail lock 68 clamps and locks to second railing 46 preventing any horizontal movement of docking station 14 until the user unlocks rail lock 68.

Front face 40 of docking station 14 is slidably coupled to first railing 44. Front face 40 includes connector port 50 which is a multi-function data port. Although in the embodiment of FIG. 2B connector port 50 is shown centered on front face 40, in alternate embodiments connector port 50 may be located anywhere on front face 40. Connector port 50 is electronically and/or communicatively coupled to data ports 54–66 and power port 52. Therefore, connector port 50 is operable to receive and transmit data to and from data ports 54–66 on rear face 42 of docking station 14 and the devices coupled to the ports on rear face 42. For instance, a signal from a monitor coupled to monitor port 62 via a data cable is transmitted from the monitor via the data cable to monitor port 62 to connector port 50.

FIGS. 3A and 3B illustrate rear faces 15 of two embodiments of example computing components 12. FIG. 3A depicts rear face 15a of computing component 12a where computing component 12a is a 1U server. FIG. 3B depicts rear face 15b of computing component 12b where computing component 12b is a 2U server. Both computing components 12 include a plurality of data ports and data plugs on rear faces 15 that are typically found on computing components such as servers. The assortment of data ports on rear faces 15 of computing components 12 allows computing components 12 to perform various data processing responsibilities in a data-center. Rear face 15a of computing component 12a may be configured with power port 70, network port 72, SCSI port 74, USB ports 76, parallel port 78, video port 80, keyboard port 82, and mouse port 84. Rear face 15b of computing component 12b may be configured with power port 86, network port 88, SCSI port 90, USB ports 92, parallel port 94, video port 96, keyboard port 98, and mouse port 100. As with rear face 42 of docking station 14, rear faces 15 of computing components 12 may further include additional data ports such as Firewire ports or A/V ports. Data ports 72–84 and 88–100 allow computing components 12 to be installed within a typical rack structure not having any docking stations.

Also included on rear faces 15 of computing components 12 are fan gratings 102 and 104 and auxiliary ports 106 and 108. Fan gratings 102 and 104 allow air to be removed from or directed into component housing 13 by a fan mounted inside component housing 13 of computing components 12 so that internal components including processors and memory may be cooled. Auxiliary ports 106a and 106b of computing component 12a and auxiliary ports 108a, 108b, and 108c of computing component 12b allow for the insertion or removal of expansion cards such as PCI (Peripheral Component Interconnect), PCI-X, EISA, or MCA expansion cards.

Data ports 72–84 and 88–100, power ports 70 and 86, fan gratings 102 and 104, and auxiliary ports 106 and 108 are typical of a rack mountable computing component. With a typical rack structure and computing component, the computing component slides into the rack structure and data cables associated with devices connect to data ports 72–84 and 88–100. But computing component 12a include connector plug 110 and computing component 12b includes connector plug 112 where connector plugs 110 and 112 are of the same mating type as connector port 50 of docking station 14 and couple with connector port 50 when installed in rack structure 16. Connector port 50 and connector plugs 110 and 112 are designed from a "blind-mate" plug and port combination. Therefore, a direct line of sight is not required to align connector port 50 and connector plugs 110 or 112 such that they properly mate when coupled. This ability further simplifies removing and reinstalling computing component 12 into and out of rack structure 16 and furthermore reduces the likelihood of plug or port damage. Furthermore, the embodiments shown in FIGS. 2 and 3 depict primarily blind-mate D-type plug and port connections for connector port 50 and connector plugs 110 and 112. Alternative embodiments may include alternative connection forms such as a blind-mate card and slot type connection similar to that used on a computer motherboard and expansion cards.

Instead of mating directly with the data cables and associated devices, computing components 12 instead mate and couple with docking station 14 when installed in rack structure 16. Docking station 14 couples with computing components 12 in a one-to-one ratio independent of the size of computing component 12. For instance, docking station 14 can mate with a computing component 12 having a size of 1U or a size of 3U and a computing component 12 having a larger size does not necessitate more than one docking station. Therefore, if rack structure 16 included forty-two 1U computing components 12, there would be forty-two docking stations 14. If rack structure 16 included fourteen 3U computing components 12, there would be fourteen docking stations 14. Each independent computing component 12 couples with its own docking station 14.

Docking station 14 and computing components 12 couple utilizing connector port 50 and connector plug 110 or 112. Front face 40 of docking station 14 and rear face 15 of computing component 12 are configured such that docking station 14 and computing component 12 mate therewith. When computing component 12 is connected to docking station 14 within rack structure 16, the data cables that would typically be connected to data ports 72–84 of computing component 12a and data ports 88–100 of computing component 12b are instead connected to data ports 54–66 and power port 52 of docking station 14. Because connector port 50 is electronically and/or communicatively coupled to data ports 54–66 on rear face 42 of docking station 14, the data transmissions received at data ports 54–66 for computing component 12 are transmitted from connector port 50 to connector plug 110 or 112. Therefore, computing components 12 are able to receive and transmit data signals through docking station 14 and connector port 50.

The coupling of docking station 14 with computing components 12 allows for computing components 12 to be removed and installed in rack structure 16 without having to disconnect and reattach the data cables. Because computing components 12 only interface with connector port 50 of docking station 14 and data ports 54–66 interface with the data cables of the multiple attached devices, there is no need to remove the data cables from data ports 54–66 when removing computing component 12 from rack structure 16. A user only need uncouple connector plug 110 or 112 from connector port 50 and slide computing component 12 out of rack structure 16. While computing component 12 is removed from rack structure 16, the associated data cables remain connected to the data ports on rear face 42 of docking station 14. In alternative embodiments, a user may desire to remove docking station 14 with computing component 12 whereby docking station 14 must be disconnected from rack structure 16 and the data cables must be disconnected from data ports 54–66 of rear face 42 of docking station 14.

In addition, docking station 14 is operable to horizontally slide to better mate and couple with computing components 12. In the embodiment shown in FIGS. 1, 2, and 3, docking station 14 has a docking station height that is less than the height of any of computing components 12 and a docking station width that is less than the width of any computing components 12. For instance, computing component 12a has a height of 1U (1.75 inches), computing component 12b has a height of 2U (3.5 inches), and docking station 14 has a height of either 0.75 inches or 1.0 inches. The ability of docking station 14 to horizontally slide allows for the placement of connector plug 110 or 112 on rear faces 15 to vary horizontally between different computing components. But because docking station 14 does not move vertically and is of a lesser height than computing components 12, there is less room for variation in the vertical placement of connector plug 110 and 112 on rear faces 15.

FIGS. 3A and 3B illustrate two different horizontal positions for docking station 14 shown by outline 114 and outline 116. Outline 114 is the position of docking station 14 when coupled to computing component 12a. Connector plug 110 is not horizontally centered on rear face 15a and therefore docking station 14 must slide towards second side 22 of rack structure 16 in order to mate with computing component 12a. Outline 116 is the position of docking station 14 when coupled to computing component 12b. Connector plug 112 is horizontally centered on rear face 15b of computing component 12b and therefore docking station 14 is centered with respect to computing component 12b when mated with computing component 12b.

The size of docking station 14 and the placement of connector plug 110 or 112 on computing components 12 takes into account the smaller height of docking station 14 and the additional items on rear faces 15. As described above, computing components 12 also include fan gratings 102 and 104 and auxiliary ports 106 and 108. Because the operation of computing components 12 generates heat, this heat must exit component housing 13 or computing components 12 will overheat and experience failures. And if fan gratings 102 and 104 are blocked so that cold air could not enter component housing 13 or hot air could not leave component housing 13, computing components 12 would not function correctly. Therefore when mated with docking station 14, it is not desirable to block the air flow of fan gratings 102 and 104. Because fan grating 102 on computing component 12a is almost the same height as the total height of computing component 12a, docking station 14 must match up with computing component 12a towards one side in order to not block the air flow of fan grating 102. But with computing component 12b and its larger 2U height, fan grating 104 does not extend the total height of computing component 12b so that there is greater flexibility in where docking station 14 and computing component 12b mate and couple. Furthermore, a user of rack structure 16 and computing components 12 may need access to auxiliary ports 106 and 108 while computing components 12 are installed in rack structure 16 and coupled with docking stations 14. The lesser height of docking station 14 versus the heights of computing components 12 allows the user to access auxiliary ports 106 and 108 without having to remove computing components 12 from rack structure 16 and docking station 14 and therefore not have to remove any of the data cabling.

Although the disclosed embodiments have been described in detail, it should be understood that various changes, substitutions and alterations can be made to the embodiments without departing from their spirit and scope. For example, the embodiment disclosed herein refers primarily to a 42U rack employing 1U servers. It is within the scope of the present disclosure to use a 24U rack or any other size rack operable to maintain computing components therein. Likewise, servers, storage devices, routers, hubs, and UPS, of sizes both smaller and larger than 1U may benefit from the teachings of the present disclosure.

What is claimed is:

1. An information handling system comprising:
at least one computing component including a component housing;
a rack structure operable to releasably maintain at least one computing component therein;
respective first and second railings operably coupled to a rear section of the rack structure;
at least one docking station including a front face and a rear face, the front face slidably coupled to the first railing and the rear face slidably coupled to the second railing;
one or more data ports operably coupled to the rear face of the docking station, the data ports operable to couple to one or more data cables;
at least one connector plug operably coupled to a rear face of the computing component; and
at least one connector port operably coupled to the front face of the docking station, the connector port operable to couple to the connector plug such that the one or more data cables are communicatively coupled to the computing component.

2. The information handling system of claim 1 further comprising a rail lock operably coupled to the second railing, the rail lock operable to prevent the docking station from sliding within the first railing and the second railing.

3. The information handling system of claim 1 further comprising a plurality of mounting brackets operably coupled to the first railing and the second railing, the mounting brackets operable to couple the docking station, the first railing, and the second railing to the rack structure.

4. The information handling system of claim 1 further comprising a power port operably coupled to the rear face of the docking station, the power port operable to couple to a power supply.

5. The information handling system of claim 1 further comprising the docking station having a height and a width, the height and the width less than a height and a width of the component housing.

6. The information handling system of claim 1 further comprising the docking station operable to horizontally slide within the first railing and the second railing allowing for alignment of the connector port with the connector plug.

7. The information handling system of claim 1 further comprising the docking station operable to couple with the computer component and allow for access to one or more auxiliary ports coupled to the rear face of the computer component.

8. The information handling system of claim 1 further comprising the connector plug operable to communicate with a plurality of devices operably coupled to the data ports on the rear face of the docking station.

9. The information handling system of claim 1 further comprising the docking station operable to releasably hold in place the computer component when the connector plug couples with the connector port.

10. The information handling system of claim 1 further comprising the computer component operable to disengage from the docking station without decoupling the data cables from the one or more data ports.

11. A rack mountable docking station comprising:
a housing including a front face and a rear face, the housing disposed between a first railing and a second railing;
the front face slidably coupled to the first railing and the rear face slidably coupled to the second railing;
a connector port operably coupled to the front face;
one or more data ports operably coupled to the rear face and operable to receive one or more data cables, the data ports communicatively coupled to the connector port; and
the connector port operable to couple to a connector plug on a rack mountable computing component such that the one or more data cable are communicatively coupled to the rack mountable computing component.

12. The docking station of claim 11 further comprising the housing disposed within a rack structure.

13. The docking station of claim 11 further comprising a rail lock operably coupled to the second railing, the rail lock operable to prevent the housing from sliding within the first railing and the second railing.

14. The docking station of claim 11 further comprising the housing operable to horizontally slide within the first railing and the second railing allowing for alignment of the connector port with the connector plug.

15. The docking station of claim 11 wherein the rack mountable computing component comprises a rack mountable server.

16. The docking station of claim 11 further comprising the first railing and the second railing operable to prevent vertical movement of the housing.

17. The docking station of claim 11 further comprising a power port operably coupled to the rear face, the power port operable to couple to a power supply.

18. A server docking station comprising:
a housing fixedly disposed within a rear section of a server rack, the rack having a first railing and a second railing coupled thereto, the housing including a front face and a rear face, the front face operable to slidably couple to the first railing, the rear face operable to slidably couple to the second railing;
one or more data ports operably coupled to the rear face, the one or more data ports operable to couple to one or more data cables; and
a connector port operably coupled to the front face, the connector port operable to couple to a connector plug on a rack mountable server such that the one or more data cable are communicatively coupled to the rack mountable server.

19. The server docking station of claim 18 farther comprising the connector port operable to allow the server to disengage without decoupling the one or more data cables from the one or more data ports.

20. The server docking station of claim 18 further comprising a power port operably coupled to the rear face, the power port operable to couple to an external power supply and provide power to the server.

* * * * *